United States Patent
Masleid

(10) Patent No.: US 7,598,573 B2
(45) Date of Patent: Oct. 6, 2009

(54) SYSTEMS AND METHODS FOR VOLTAGE DISTRIBUTION VIA MULTIPLE EPITAXIAL LAYERS

(76) Inventor: Robert Paul Masleid, 17266 Eaton La., Monte Sereno, CA (US) 95930

( * ) Notice: Subject to any disclaimer, the term of this patent is extended or adjusted under 35 U.S.C. 154(b) by 144 days.

(21) Appl. No.: 10/990,886

(22) Filed: Nov. 16, 2004

(65) Prior Publication Data

US 2006/0102958 A1     May 18, 2006

Related U.S. Application Data

(63) Continuation-in-part of application No. 10/990,885, filed on Nov. 16, 2004.

(51) Int. Cl.
    *H01L 29/772* (2006.01)
(52) U.S. Cl. .................... 257/369; 257/376
(58) Field of Classification Search ............ 257/371, 257/373, 375, 376
See application file for complete search history.

(56) References Cited

U.S. PATENT DOCUMENTS

| | | | | |
|---|---|---|---|---|
| 3,581,165 A | * | 5/1971 | Seelbach et al. | ............ 257/544 |
| 3,772,097 A | * | 11/1973 | Davis | ............ 438/395 |
| 5,119,162 A | | 6/1992 | Todd et al. | |
| 5,153,697 A | * | 10/1992 | Mosher et al. | ............ 257/296 |
| 5,256,582 A | | 10/1993 | Mosher et al. | |
| 5,447,876 A | | 9/1995 | Moyer et al. | |
| 5,448,081 A | * | 9/1995 | Malhi | ............ 257/77 |
| 5,622,880 A | | 4/1997 | Burr et al. | ............ 438/194 |
| 5,623,159 A | | 4/1997 | Monk et al. | |
| 5,719,733 A | * | 2/1998 | Wei et al. | ............ 361/56 |
| 5,753,958 A | | 5/1998 | Burr et al. | ............ 257/392 |
| 5,780,912 A | | 7/1998 | Burr et al. | ............ 257/408 |
| 5,789,786 A | * | 8/1998 | Gaffur et al. | ............ 257/369 |
| 6,048,746 A | | 4/2000 | Burr | |
| 6,087,892 A | | 7/2000 | Burr | |
| 6,091,283 A | | 7/2000 | Murgula et al. | |
| 6,100,567 A | | 8/2000 | Burr | ............ 257/365 |
| 6,137,142 A | | 10/2000 | Burr | ............ 257/349 |
| 6,169,310 B1 | | 1/2001 | Kalnitsky et al. | |
| 6,218,708 B1 | | 4/2001 | Burr | ............ 257/372 |
| 6,249,027 B1 | | 6/2001 | Burr | ............ 257/350 |
| 6,303,444 B1 | | 10/2001 | Burr | |
| 6,489,224 B1 | | 12/2002 | Burr | ............ 438/526 |

(Continued)

FOREIGN PATENT DOCUMENTS

EP      0422250      4/1991

(Continued)

OTHER PUBLICATIONS

Chandrakasan A., Bowhill W., Fox F. "Design of High-Performance Microprocessor Circuits", 2001 by the Institute of Electrical and Electronics Engineers, Inc. 3 Park Ave., 17th Floor, New York, NY 10016-5997. p. 58.

(Continued)

*Primary Examiner*—Stephen W Smoot

(57) ABSTRACT

Systems and methods for voltage distribution via multiple epitaxial layers. In accordance with a first embodiment of the present invention, an integrated circuit comprises a wafer substrate of a connectivity type. A first epitaxial layer of a connectivity type is disposed upon a second epitaxial layer of an opposite connectivity type, which is disposed upon the wafer substrate.

15 Claims, 2 Drawing Sheets

U.S. PATENT DOCUMENTS

| | | | |
|---|---|---|---|
| 6,489,804 B1 | 12/2002 | Burr | 326/38 |
| 6,507,080 B2 * | 1/2003 | Jang et al. | |
| 6,552,601 B1 | 4/2003 | Burr | 327/537 |
| 6,605,971 B1 | 8/2003 | Burr | 327/211 |
| 6,621,318 B1 | 9/2003 | Burr | 327/218 |
| 6,664,608 B1 * | 12/2003 | Burr | 257/549 |
| 6,838,328 B1 | 1/2005 | Burr | 438/199 |
| 6,936,898 B2 | 8/2005 | Pelham et al. | |
| 7,015,741 B2 | 3/2006 | Tschanz et al. | |
| 7,098,512 B1 | 8/2006 | Pelham et al. | |
| 7,217,962 B1 | 5/2007 | Masleid | |
| 2001/0028577 A1 | 10/2001 | Sung et al. | |
| 2003/0146476 A1 | 8/2003 | Kaneko et al. | |
| 2004/0053439 A1 | 3/2004 | Schafbauer et al. | |
| 2004/0219733 A1 | 11/2004 | Algotsson et al. | |

FOREIGN PATENT DOCUMENTS

| | | |
|---|---|---|
| EP | 0424926 | 5/1991 |
| EP | 0624909 | 4/1999 |

OTHER PUBLICATIONS

Non-Final Office Action Mailed Mar. 22, 2006; 10990885; TRAN-P346.
Final Office Action Mailed Nov. 15, 2006; 10990885; TRAN-P346.
Non-Final Office Action Mailed Jun. 8, 2007; 10990885; TRAN-P346.
Final Office Action Mailed Apr. 30, 2008; 10990885; TRAN-P346.
Non-Final Office Action Mailed Oct. 29, 2008; 10990885; TRAN-P346.

* cited by examiner

SYSTEMS AND METHODS FOR VOLTAGE DISTRIBUTION VIA MULTIPLE EPITAXIAL LAYERS

RELATED APPLICATIONS

This Application is a Continuation-in-Part of commonly-owned U.S. patent application Ser. No. 10/990,885, filed Nov. 16, 2004, entitled "Systems and Methods for Voltage Distribution via Epitaxial Layers" to Masleid, which is hereby incorporated herein by reference in its entirety.

Commonly-owned United States patent application Ser. No.10/334,272 filed Dec. 31,2002, now U.S. Patent No. 6,936,898, entitled "Diagonal Deep Well Region for Routing Body-Bias Voltage for MOSFETs in Surface Well Regions" to Pelham and Burr, is hereby incorporated herein by reference in its entirety as reference material.

FIELD OF THE INVENTION

Embodiments in accordance with the present invention relate to systems and methods for voltage distribution in an integrated circuit device via multiple epitaxial layers.

BACKGROUND

It is desirable to distribute voltages, for example, body biasing voltages, within an integrated circuit.

SUMMARY OF THE INVENTION

Therefore, systems and methods for voltage distribution in an integrated circuit device via multiple epitaxial layers would be highly desirable.

Accordingly, systems and methods for voltage distribution via multiple epitaxial layers are disclosed. In accordance with a first embodiment of the present invention, an integrated circuit comprises a wafer substrate of a connectivity type. A first epitaxial layer of a connectivity type is disposed upon a second epitaxial layer of an opposite connectivity type, which is disposed upon the wafer substrate.

In accordance with another embodiment of the present invention, an integrated circuit comprises a first epitaxial layer of a conduction type for conducting a first voltage substantially parallel to a plane of the first epitaxial layer. The integrated circuit further comprises a second epitaxial layer of opposite conduction type underlying the first epitaxial layer for conducting a second voltage substantially parallel to a plane of the second epitaxial layer.

DETAILED DESCRIPTION OF THE INVENTION

In the following detailed description of the present invention, systems and methods for voltage distribution via multiple epitaxial layers, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

SYSTEMS AND METHODS FOR VOLTAGE DISTRIBUTION VIA MULTIPLE EPITAXIAL LAYERS

Embodiments in accordance with the present invention are described in the context of design and operation of integrated semiconductors. More particularly, embodiments of the present invention relate to systems and methods for voltage distribution via multiple epitaxial layers. It is appreciated, however, that elements of the present invention may be utilized in other areas of semiconductor operation.

The following description of embodiments in accordance with the present invention is directed toward coupling a body-bias voltage to pFETs (or p-type field effect transistors) formed in surface N-wells and/or to nFETs (or n-type field effect transistors) formed in P– epitaxy when an N-well process is utilized. It is to be appreciated, however, that embodiments in accordance with the present invention are equally applicable to coupling a body-bias voltage to nFETs (or n-type field effect transistors) formed in surface P-wells and/or to pFETs (or p-type field effect transistors) formed in surface N-epitaxy when a P-well process is utilized. Consequently, embodiments in accordance with the present invention are well suited to semiconductors formed in both p-type and n-type materials, and such embodiments are considered within the scope of the present invention.

Figure 1:
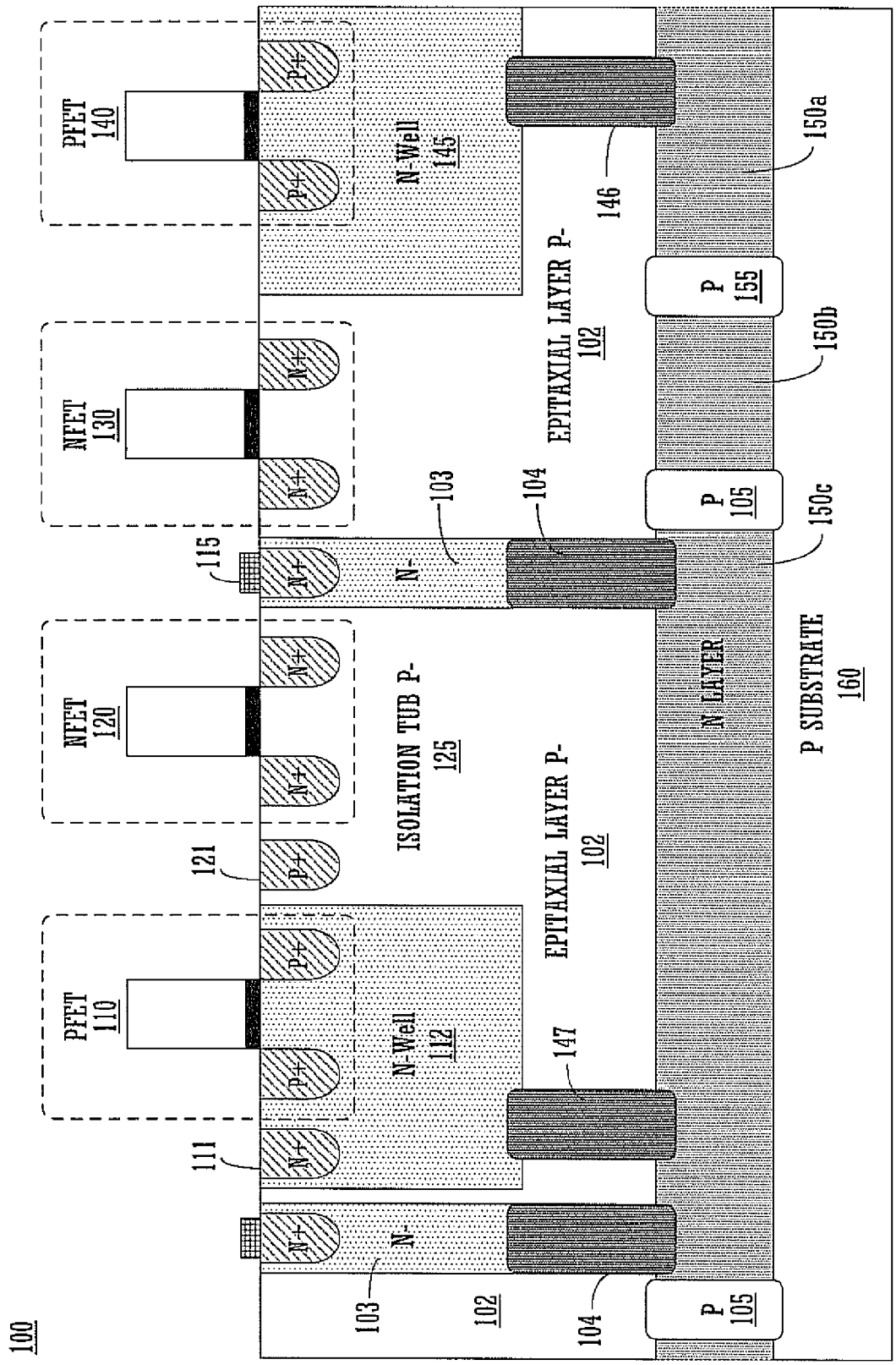
FIG. 1 illustrates a side sectional view of a portion of integrated circuit, in accordance with embodiments of the present invention.

FIG. 1 illustrates a side sectional view of a portion of integrated circuit 100, in accordance with embodiments of the present invention. Integrated circuit 100 comprises a wafer substrate 160, for example, of P+ type material. Disposed thereon is n-type material layer 150. N-type material layer 150 is typically an epitaxial layer. Disposed on n-type material layer 150 is at least one epitaxy layer 102 of P– type material. It is to be appreciated that an epitaxial layer of a first conduction type, e.g., p-type material 102, is not conventionally disposed on a layer of a second conduction type, e.g., n-type material layer 150.

Embodiments of the present invention are well suited to a variety of processes to form multiple epitaxial layers. For example, multiple epitaxial layers can be formed in a substantially continuous process in which dopant types and/or concentration are changed to create differing characteristics, e.g., layers. Alternatively, one epitaxial layer can be formed at a first time, while a second epitaxial layer is formed at a substantially different time and/or utilizing a different process, e.g., within a separate and distinct processing apparatus.

N-type well diffusion 103 forms a continuous "guard ring" or wall forming an outside border of isolation tub 125. It is to be appreciated that embodiments in accordance with the present invention are well suited to a variety of shapes of a wall structure (as would be seen in plan view) for n-type well diffusion 103. For example, a plan view of n-type well diffusion 103 can be rectangular, have curving features, e.g., be convex or non-convex, and/or comprise a variety of other closed shapes.

Conventional isolation tubs are known to be completed by a deep n-well layer or plate underlying and coupled to such a guard ring, forming a bottom of an isolation structure. In contrast, n-type material layer 150 forms a bottom of isolation tub 125. Segments of a deep n-well 104 are disposed beneath n-type well diffusion 103 coupling n-type well diffusion 103 to n-type material layer 150. Deep n-well 104 forms a continuous "guard ring" or wall that generally follows the contour of n-type diffusion 103. The deep n well 104 forms an ohmic connection between the N− material of the well diffusion 103 and the N material of n-type material layer 150.

Integrated circuit 100 comprises a plurality of active devices, for example, PFETs 110 and 140, and NFETs 120 and 130. It is to be appreciated that integrated circuit 100 will typically comprise more than the four devices illustrated. NFET 120 is formed within an isolation tub 125 comprising P− epitaxial material that has been electrically isolated from other portions of the P− epitaxial layer 102 by the combination of n-type well diffusion 103 and deep n-well 104. Isolation tub 125 is further isolated from substrate 160 by n-type material layer 150. Within isolation tub 125, NFET 120 can be provided a body biasing voltage independent of other body biasing voltages applied to other devices outside of isolation tub 125. For example, a body biasing voltage can be provided to isolation tub 125 via P-tap 121.

It is to be appreciated that P-tap 121 need not be closely associated with NFET 120. An epitaxial layer, e.g., epitaxial layer 102, is highly conductive. Such conductivity is sufficient for coupling a body biasing voltage, e.g., from a single tap or a limited number of taps, to a plurality of NFETs within an isolation tub, e.g., isolation tub 125.

It is to be appreciated that it is sometimes desirable to form n-type field effect transistors, e.g., NFETs 120 and/or 130, in surface p-wells within a surface p-type epitaxial layer in order to obtain a desirable characteristic of such devices. For example, such an optional surface p-well (not shown) could be formed to include NFET 120 and p-tap 121. Embodiments in accordance with the present invention are well suited to such optional surface well structures.

It is appreciated that p-type field effect transistors are generally formed in n-type material. PFET 110 is formed within n-well 112. N-well 112 is formed within isolation tub 125 of p-type material. It is appreciated that n-well 112 is electrically isolated from other n-type material of integrated circuit 100, e.g., n-well 112 is electrically isolated from n-type well diffusion 103, deep n-well 104 and n-type material layer 150. For example, n-well 112 does not extend beyond a depth of epitaxial layer 102. Within n-well 112, PFET 110 can be provided a body biasing voltage independent of other body biasing voltages applied to other devices outside of n-well 112. For example, a body biasing voltage can be provided to n-well 112 via N-tap 111. In a manner analogous to that of p-tap 121, it is to be appreciated that n-tap 111 need not be closely associated with PFET 110.

Isolation tub 125 can form a body-biasing domain. A body-biasing domain typically comprises a portion of circuitry of an integrated circuit, e.g., integrated circuit 100, typically comprising both n-type field effect transistors, e.g., NFET 120, and p-type field effect transistors, e.g., PFET 110. A body-biasing domain enables circuits within such a body-biasing domain, e.g., NFET 120 and/or PFET 110, to operate at body biasing voltages that are different from body biasing voltages utilized for other circuitry of an integrated circuit located outside of such a body-biasing domain. For example, NFET 120 and/or PFET 110 can operate with different body biasing voltage(s) than NFET 130 and/or PFET 140 of integrated circuit 100.

Still with reference to FIG. 1, NFET 130 is formed in epitaxial layer 102 of integrated circuit 100. Within epitaxial layer 102, NFET 130 can be provided a body biasing voltage. For example, a body biasing voltage can be provided to epitaxial layer 102 from substrate 160 via P-type via 155. P-type via 155 couples P substrate 160 with epitaxial layer 102.

P-type via 155 does not require a large vertical cross-sectional area, e.g., in plan view, in order to comprise suitable conduction characteristics, e.g., low resistance. For example, P-type via 155 is well suited to a small circular cross section as seen in plan view. It is appreciated that P-type via 155 is short in absolute terms, spanning only a distance from a bottom portion of epitaxial layer 102 to substrate 160. It is to be further appreciated that P-type via 155 does not form an isolating structure, e.g., a guard ring. For example, n-type material layer 150A is electrically contiguous with n-type material layer 150B. It is to be further appreciated that regions of epitaxial layer 102 coupled to substrate 160, for example, regions of epitaxial layer 102 that are not isolated, e.g., regions other than isolation tub 125 in FIG. 1, do not require surface taps, e.g., p-tap 121 of FIG. 1.

P-type via 155 is well suited to a variety of structure types and/or construction methods, in accordance with embodiments of the present invention. For example, p-type via 155 can comprise a deep p-well with sufficient doping to overcome the conductivity of n-type material layer 150.

It is to be appreciated that this novel distribution of a body biasing voltage via a substrate can reduce a need for connection structures on a wafer surface, for example, tap and contact structures as well as metallization, utilized to distribute body biasing voltage(s) under the conventional art.

PFET 140 is formed within n-well 145 within epitaxial layer 102. N-well 145 is electrically coupled to n-type material layer 150 via deep n-well via structure 146. A body biasing voltage can be coupled to n-well 145 from n-type material layer 150A via deep n-well via 146. It is to be appreciated that deep n-well via 146 serves as a via structure, in a manner analogous to well known vias between wiring levels of integrated circuit and/or printed wiring boards. It is to be further appreciated that this novel distribution of a body biasing voltage via a wafer substrate can reduce or eliminate a need for connection structures on a wafer surface, for example, tap and contact structures as well as metallization, utilized to distribute body biasing voltage(s) under the conventional art.

Deep n-well via 146 does not require a large vertical cross-sectional area, e.g., in plan view, in order to comprise suitable conduction characteristics, e.g., low resistance. For example, deep n-well via 146 is well suited to a small circular cross section as seen in plan view. It is appreciated that deep n-well via 146 is short in absolute terms, spanning only a distance from a bottom portion of n-well 145 to n-type material layer 150. Consequently, deep n-well via 146 can be substantially smaller than n-well 145 in length and/or breadth while retaining desirable conduction characteristics. A small size of deep n-well via 146 aids the lateral conductance of epitaxy layer 102 in a function of distributing a body biasing voltage to NFET 130. It is to be further appreciated that deep n-well via 146 does not form an isolating structure, e.g., a guard ring.

In accordance with an alternative embodiment of the present invention, a guard ring can comprise active devices. For example, n-well 103 of FIG. 1 can be replaced with a structure similar to n-well/via 145 comprising PFET 140. It is to be appreciated that in such a case deep n-well via 146 would need to be replaced by a continuous structure such as deep n-well 104 to maintain isolation of isolation tub 125.

It is to be further appreciated that the distribution of a body biasing voltage via n-type material layer 150 described herein is substantially lateral within n-type material layer 150.

In accordance with another embodiment of the present invention, an n-type tap into an n-well coupled to n-type material layer 150, e.g., n-tap 115 or a tap (not shown) into n-well 145, can optionally be constructed to provide a convenient tap through epitaxial layer 102 to n-type material layer 150. Similarly, a p-tap (not shown) into epitaxial layer 102 outside of isolation tub 125 can optionally be constructed to provide a convenient tap from the top surface of integrated circuit 100 to substrate 160.

In contrast to p-type via 155, p-type wall structure 105 isolates portions of n-type material layer 150 from one another. Such isolation can enable n-type material layer 150 to distribute different voltages, e.g., n-well body biasing voltages, to different regions of integrated circuit 100. It is to be appreciated that p-type wall structure 105 should be formed on the outside (in plan view) of an n-type isolation structure, e.g., the guard ring formed by n-well diffusion 103 and deep n-well 104. In general, p-type wall structure 105 can have a plan-view shape substantially similar to that of n-well diffusion 103 and deep n-well 104.

For example, n-type material layer 150C is electrically isolated by p-type wall structure 105 from n-type material layers 150A and 150B. N-type material layer 150C can couple a first body biasing voltage to PFET 110 from n-tap 115 via n-well 103, deep n-well 104 via deep n-well via 147 to n-well 112 which houses the body of PFET 110. Meanwhile, n-type material layer 150A can couple a second body biasing voltage to PFET 140 via deep n-well via 146 to n-well 145, housing the body of PFET 140.

It is to be appreciated that p-type wall structure 105 will generally couple substrate 160 with epitaxial layer 102. In accordance with embodiments of the present invention, p-type wall structure 105 or similar isolating structures can serve some or all of the coupling function provided by p-type via structure 155. Consequently, in some embodiments, p-type via structure 155 can be advantageously eliminated.

Figure 2:
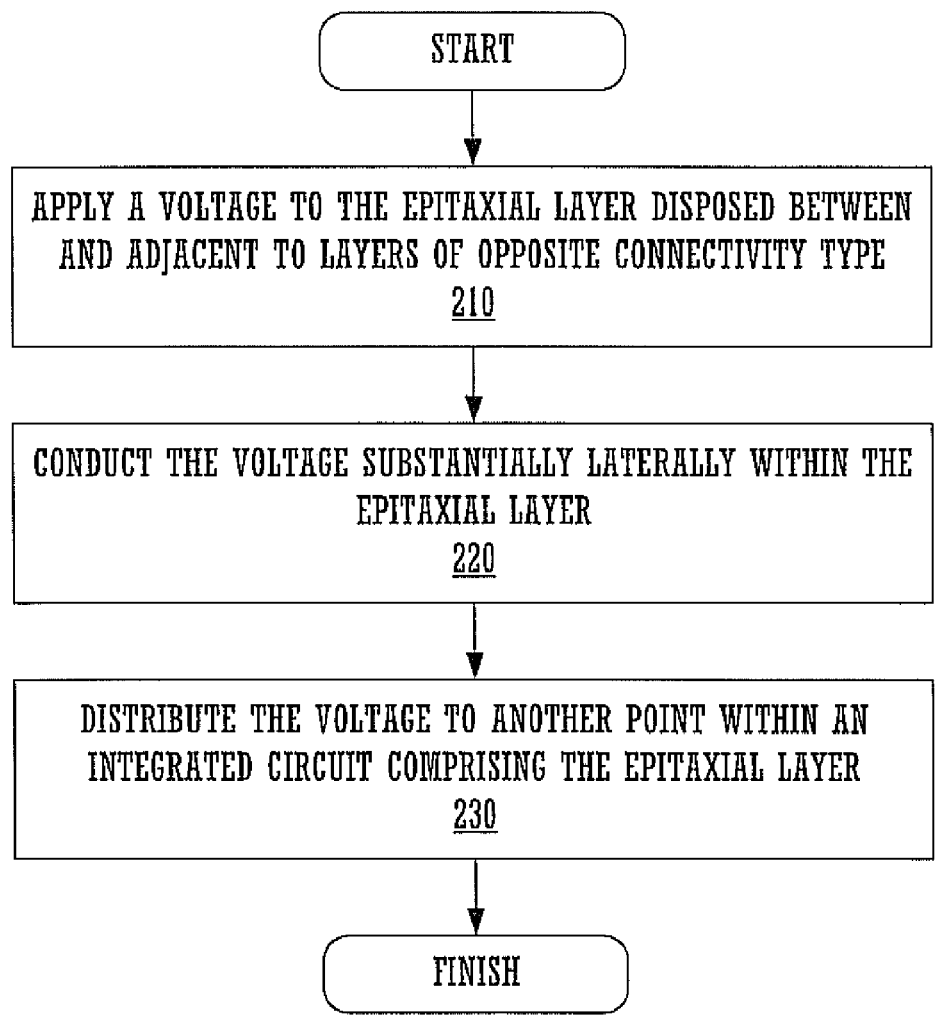
FIG. 2 illustrates steps in a method of voltage distribution via an epitaxial layer, in accordance with embodiments of the present invention.

FIG. 2 illustrates a method 200 of distributing voltage via an epitaxial layer, in accordance with embodiments of the present invention. In 210, a voltage, for example a body biasing voltage, is applied to the epitaxial layer disposed between and adjacent to layers of opposite connectivity type. For example, a voltage can be applied to n-tap 115 of FIG. 1. The voltage is coupled to n-type material layer 150 via n-type well diffusion 103 and deep n-well 104 (FIG. 1).

In 220, the voltage is conducted substantially laterally within the epitaxial layer. In 230, the voltage is distributed from the epitaxial layer, e.g., n-type material layer 150 (FIG. 1), to another point within an integrated circuit comprising the epitaxial layer.

For example, referring once again to FIG. 1, a body biasing voltage can be coupled to PFET 110 from n-tap 115 via n-well 112, deep n-well via 147, n-type material layer 150C, n-type well diffusion 103 and deep n-well 104.

Embodiments in accordance with the present invention, systems and methods for voltage distribution via multiple epitaxial layers, are thus described. While the present invention has been described in particular embodiments, it should be appreciated that the present invention should not be construed as limited by such embodiments, but rather construed according to the below claims.

What is claimed is:

1. An integrated circuit comprising:
   a wafer substrate of a conductivity type;
   a first epitaxial layer of a conductivity type disposed upon a second epitaxial layer of an opposite conductivity type disposed upon said wafer; and
   a deep well of said conductivity type for coupling a body biasing voltage from said wafer substrate to body terminals of field effect transistors formed in said first epitaxial layer.

2. The integrated circuit of claim 1 further comprising a via structure formed in a hole of said second epitaxial layer wherein said body biasing voltage is coupled from said wafer substrate to said first epitaxial layer by means of said via structure.

3. The integrated circuit of claim 2 wherein said body biasing voltage is conducted substantially laterally within said wafer substrate.

4. The integrated circuit of claim 1 wherein said layer of an opposite conductivity couples a body biasing voltage to body terminals of a field effect transistor formed in a well of said opposite conductivity type.

5. The integrated circuit of claim 4 wherein said body biasing voltage is conducted substantially laterally within said layer of an opposite conductivity.

6. The integrated circuit of claim 4 further comprising a deep well of said opposite conductivity type wherein said body biasing voltage is coupled from said second epitaxial layer to said well via said deep well.

7. The integrated circuit of claim 1 further comprising a tap of said opposite conductivity type formed in a well of said opposite conductivity type for coupling a voltage to said second epitaxial layer.

8. The integrated circuit of claim 1 further comprising a tap of said conductivity type formed in said second epitaxial layer for coupling a voltage to said wafer substrate.

9. An integrated circuit comprising:
   a first epitaxial layer of a conduction type for conducting a first voltage substantially parallel to a plane of said first epitaxial layer;
   a second epitaxial layer of opposite conduction type underlying said first epitaxial layer for conducting a second voltage substantially parallel to a plane of said second epitaxial layer; and
   complementary metal oxide semiconductor devices disposed in said first epitaxial layer.

10. The integrated circuit of claim 9 wherein said first voltage is a body biasing voltage for a field effect transistor formed in said first epitaxial layer.

11. The integrated circuit of claim 10 further comprising a tap in said first epitaxial layer for coupling said body biasing voltage to said first epitaxial layer.

12. The integrated circuit of claim 9 comprising a well of said opposite conduction type within said first epitaxial layer for forming a field effect transistor.

13. The integrated circuit of claim 12 comprising a deep structure of said opposite conduction type for coupling said well to said second epitaxial layer.

14. The integrated circuit of claim 13 wherein conduction through said deep structure is substantially perpendicular to said plane of said first epitaxial layer.

15. The integrated circuit of claim 13 wherein said deep structure is for coupling a body biasing voltage from said second epitaxial layer to said well.

* * * * *

UNITED STATES PATENT AND TRADEMARK OFFICE
CERTIFICATE OF CORRECTION

PATENT NO. : 7,598,573 B2 Page 1 of 1
APPLICATION NO. : 10/990886
DATED : October 6, 2009
INVENTOR(S) : Robert Paul Masleid It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 300 days.

Signed and Sealed this

Twenty-eighth Day of September, 2010

David J. Kappos
*Director of the United States Patent and Trademark Office*